US012342703B2

(12) United States Patent
Jing

(10) Patent No.: US 12,342,703 B2
(45) Date of Patent: Jun. 24, 2025

(54) DISPLAY PANEL AND DISPLAY DEVICE

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Xiaofang Jing, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/434,767

(22) PCT Filed: Jul. 19, 2021

(86) PCT No.: PCT/CN2021/107042
§ 371 (c)(1),
(2) Date: Aug. 30, 2021

(87) PCT Pub. No.: WO2022/241938
PCT Pub. Date: Nov. 24, 2022

(65) Prior Publication Data
US 2024/0032370 A1    Jan. 25, 2024

(30) Foreign Application Priority Data

May 17, 2021 (CN) .......................... 202110535813.0

(51) Int. Cl.
*H10K 59/35* (2023.01)
*H10K 59/10* (2023.01)
*H10K 59/80* (2023.01)

(52) U.S. Cl.
CPC ........... *H10K 59/35* (2023.02); *H10K 59/876* (2023.02); *H10K 59/10* (2023.02)

(58) Field of Classification Search
CPC ....... H10K 59/35; H10K 59/876; H10K 59/10
See application file for complete search history.

(56) References Cited

U.S. PATENT DOCUMENTS

| 2013/0105776 A1* | 5/2013 | Ishizuya | H10K 50/852 |
| | | | 257/40 |
| 2014/0306193 A1* | 10/2014 | Lee | H10K 50/854 |
| | | | 257/40 |

(Continued)

FOREIGN PATENT DOCUMENTS

| CN | 101351065 | 1/2009 |
| CN | 103094311 | 5/2013 |

(Continued)

OTHER PUBLICATIONS

Scientific Polymer Products Inc "Refractive index of polymers by Index", https://web.archive.org/web/20210420011726/https://scipoly.com/technical-library/refractive-index-of-polymers-by-index/ (Year: 2021).*

Primary Examiner — Joseph C. Nicely
Assistant Examiner — Alvin L Lee

(57) ABSTRACT

A display panel includes a plurality of first light-emitting devices and a plurality of second light-emitting devices. A ratio of a cavity length of each of the first light-emitting devices and a wavelength of a corresponding light-emitting color is a first ratio. A ratio of a cavity length of each of the second light-emitting devices and a wavelength of a corresponding light-emitting color is a second ratio. The first ratio and the second ratio are different.

10 Claims, 4 Drawing Sheets

(56) References Cited

U.S. PATENT DOCUMENTS

| | | | |
|---|---|---|---|
| 2017/0033306 A1* | 2/2017 | Song | H10K 50/11 |
| 2018/0114937 A1 | 4/2018 | Ito | |
| 2018/0226616 A1* | 8/2018 | Zhang | H10K 50/852 |
| 2019/0013364 A1 | 1/2019 | Yokota | |
| 2019/0198578 A1* | 6/2019 | Jeong | H10K 50/858 |

FOREIGN PATENT DOCUMENTS

| | | | |
|---|---|---|---|
| CN | 105280838 | 1/2016 | |
| CN | 106410050 | 2/2017 | |
| CN | 107017347 | 8/2017 | |
| CN | 108511618 | 9/2018 | |
| CN | 108615816 A * | 10/2018 | H01L 27/32 |
| CN | 109892014 | 6/2019 | |
| CN | 111244324 | 6/2020 | |
| CN | 111477758 | 7/2020 | |
| EP | 2172992 A1 * | 4/2010 | H01L 51/5262 |

* cited by examiner

DISPLAY PANEL AND DISPLAY DEVICE

RELATED APPLICATIONS

This application is a National Phase of PCT Patent Application No. PCT/CN2021/107042 having International filing date of Jul. 19, 2021, which claims the benefit of priority of Chinese Patent Application No. 202110535813.0 filed on May 17, 2021. The contents of the above applications are all incorporated by reference as if fully set forth herein in their entirety.

FIELD AND BACKGROUND OF THE INVENTION

The present disclosure relates to the field of display, and particularly to a display panel and a display device.

In current organic light-emitting diode (OLED) display panels, resonant cavity effects enhance color saturation of emitted lights and light-emitting efficiency of devices. For example, for light-emitting devices with different colors, by adjusting a microcavity distance between a center of each of the light-emitting devices and an anode layer, and making the microcavity distance have a certain ratio to a wavelength of a corresponding color, light-emitting efficiency of the light-emitting devices is improved. However, the light-emitting devices with different colors have different light-emitting efficiency, so a current setting of the microcavity distances cannot make the light-emitting efficiency of each of the light-emitting devices reach an optimal value.

Therefore, there is an urgent need for a display panel and a display device to solve the above technical problem.

SUMMARY OF THE INVENTION

The present disclosure provides a display panel and a display device, which can solve a technical problem that light-emitting efficiency of each of light-emitting devices in current organic light-emitting diode (OLED) display panels cannot reach an optimal value.

In order to solve the above technical problem, the present disclosure provides the following technical solutions.

The present disclosure provides a display panel. The display panel comprises a light-emitting material layer and a first electrode layer disposed on a side of the light-emitting material layer. The light-emitting material layer comprises:
   a plurality of first light-emitting devices, wherein a ratio of a first distance between a light-emitting center of each of the first light-emitting devices and the first electrode layer and a wavelength of a light-emitting color of the first light-emitting device is a first ratio; and
   a plurality of second light-emitting devices, wherein a ratio of a second distance between a light-emitting center of each of the second light-emitting devices and the first electrode layer and a wavelength of a light-emitting color of the second light-emitting device is a second ratio, and the first ratio is not equal to the second ratio.

In an embodiment, the first light-emitting devices comprise a plurality of red light-emitting devices and a plurality of green light-emitting devices, and the second light-emitting devices comprise a plurality of blue light-emitting devices. The wavelength of the light-emitting color of the first light-emitting devices is greater than the wavelength of the light-emitting color of the second light-emitting devices, and the first ratio is less than the second ratio.

In an embodiment, the first ratio is 1:4, and the second ratio is 1:4/3.

In an embodiment, the display panel further comprises a cavity length adjusting layer disposed between the first electrode layer and the light-emitting material layer. The cavity length adjusting layer comprises a plurality of red adjusting units corresponding to the red light-emitting devices, a plurality of blue adjusting units corresponding to the blue light-emitting devices, and a plurality of green adjusting units corresponding to the green light-emitting devices. A thickness of the blue adjusting units is greater than a thickness of the red adjusting units, and the thickness of the red adjusting units is greater than a thickness of the green adjusting units.

In an embodiment, a thickness of the blue light-emitting devices is greater than a thickness of the red light-emitting devices, and the thickness of the red light-emitting devices is greater than a thickness of the green light-emitting devices.

In an embodiment, the display panel further comprises a second electrode layer disposed on another side of the light-emitting material layer and opposite to the first electrode layer. The first electrode layer is an anode layer, and the second electrode layer is a cathode layer.

In an embodiment, the display panel further comprises a first functional layer and a second functional layer respectively disposed on opposite sides of the first light-emitting devices and the second light-emitting devices. The first functional layer is disposed on the anode layer. The first functional layer comprises a plurality of first red functional units corresponding to the red light-emitting devices, a plurality of first blue functional units corresponding to the blue light-emitting devices, and a plurality of first green functional units corresponding to the green light-emitting devices. A thickness of the first blue functional units is greater than a thickness of the first red functional units, and the thickness of the first red functional units is greater than a thickness of the first green functional units.

In an embodiment, the display panel further comprises a light extracting layer disposed on a side of the cathode layer away from the light-emitting material layer. The light extracting layer comprises a plurality of light extracting units disposed at intervals.

In an embodiment, the light extracting units comprise a plurality of red light extracting units corresponding to the red light-emitting devices, a plurality of blue light extracting units corresponding to the blue light-emitting devices, and a plurality of green light extracting units corresponding to the green light-emitting devices. A thickness of the red light extracting units is greater than a thickness of the green light extracting units, and the thickness of the green light extracting units is greater than a thickness of the blue light extracting units.

In an embodiment, the light extracting layer further comprises a light extracting part formed as an entire layer, and a refractive index of the light extracting part is less than a refractive index of the light extracting units.

The present disclosure further provides a display device comprising a display panel. The display panel comprises a light-emitting material layer and a first electrode layer disposed on a side of the light-emitting material layer. The light-emitting material layer comprises:
   a plurality of first light-emitting devices, wherein a ratio of a first distance between a light-emitting center of each of the first light-emitting devices and the first electrode layer and a wavelength of a light-emitting color of the first light-emitting device is a first ratio; and a plurality of second light-emitting devices, wherein a ratio of a second distance between a light-emitting center of each of the second light-emitting devices and the first electrode layer and a wavelength of a light-emitting color of the second light-emitting device is a second ratio, and the first ratio is not equal to the second ratio.

In an embodiment, the first light-emitting devices comprise a plurality of red light-emitting devices and a plurality of green light-emitting devices, and the second light-emitting devices comprise a plurality of blue light-emitting devices. The wavelength of the light-emitting color of the first light-emitting devices is greater than the wavelength of the light-emitting color of the second light-emitting devices, and the first ratio is less than the second ratio.

In an embodiment, the first ratio is 1:4, and the second ratio is 1:4/3.

In an embodiment, the display panel further comprises a cavity length adjusting layer disposed between the first electrode layer and the light-emitting material layer. The cavity length adjusting layer comprises a plurality of red adjusting units corresponding to the red light-emitting devices, a plurality of blue adjusting units corresponding to the blue light-emitting devices, and a plurality of green adjusting units corresponding to the green light-emitting devices. A thickness of the blue adjusting units is greater than a thickness of the red adjusting units, and the thickness of the red adjusting units is greater than a thickness of the green adjusting units.

In an embodiment, a thickness of the blue light-emitting devices is greater than a thickness of the red light-emitting devices, and the thickness of the red light-emitting devices is greater than a thickness of the green light-emitting devices.

In an embodiment, the display panel further comprises a second electrode layer disposed on another side of the light-emitting material layer and opposite to the first electrode layer. The first electrode layer is an anode layer, and the second electrode layer is a cathode layer.

In an embodiment, the display panel further comprises a first functional layer and a second functional layer respectively disposed on opposite sides of the first light-emitting devices and the second light-emitting devices. The first functional layer is disposed on the anode layer. The first functional layer comprises a plurality of first red functional units corresponding to the red light-emitting devices, a plurality of first blue functional units corresponding to the blue light-emitting devices, and a plurality of first green functional units corresponding to the green light-emitting devices. A thickness of the first blue functional units is greater than a thickness of the first red functional units, and the thickness of the first red functional units is greater than a thickness of the first green functional units.

In an embodiment, the display panel further comprises a light extracting layer disposed on a side of the cathode layer away from the light-emitting material layer. The light extracting layer comprises a plurality of light extracting units disposed at intervals.

In an embodiment, the light extracting units comprise a plurality of red light extracting units corresponding to the red light-emitting devices, a plurality of blue light extracting units corresponding to the blue light-emitting devices, and a plurality of green light extracting units corresponding to the green light-emitting devices. A thickness of the red light extracting units is greater than a thickness of the green light extracting units, and the thickness of the green light extracting units is greater than a thickness of the blue light extracting units.

In an embodiment, the light extracting layer further comprises a light extracting part formed as an entire layer, and a refractive index of the light extracting part is less than a refractive index of the light extracting units.

In the embodiments of the present disclosure, two or more types of light-emitting devices are disposed, a ratio of a distance between light-emitting centers of each type of the light-emitting devices and a first electrode layer and a wavelength of a light-emitting color of the type of the light-emitting devices is different, so that microcavities with different ratios are formed. This can further increase light-emitting efficiency of the light-emitting devices with different colors, improve color saturation of emitted lights, and prolong light-emitting life of the light-emitting devices.

DESCRIPTION OF SPECIFIC EMBODIMENTS OF THE INVENTION

The present disclosure provides a display panel and a display device. In order to make purposes, technical solutions, and effects of the present invention clearer and more definite, the present invention will be further described in detail below with reference to accompanying drawings and embodiments. It should be understood that specific embodiments described herein are only used to explain the present invention, not used to limit the present invention.

The present disclosure provides a display panel and a display device, which will be respectively described in detail below. It should be noted that a description order of the following embodiments is not intended to limit a preferred order of the embodiments.

Figure 1:
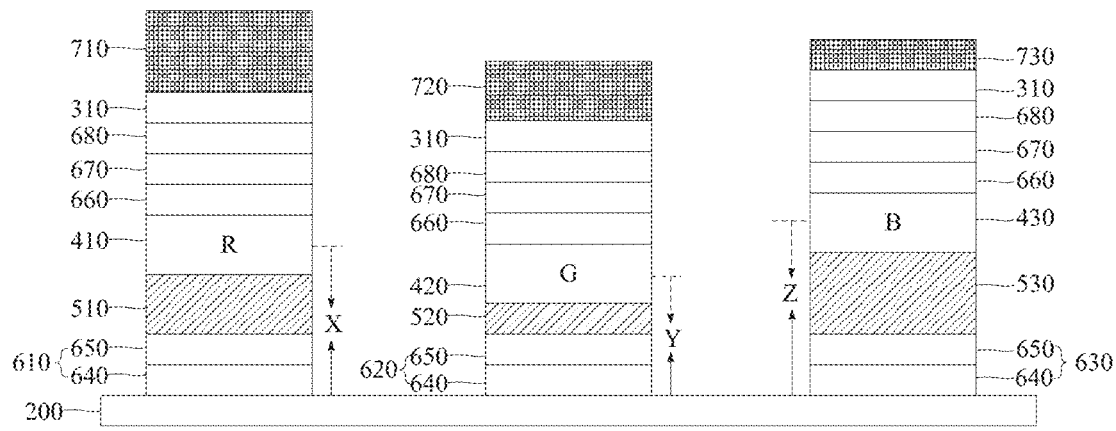
FIG. 1 is a partial structural schematic diagram of a first structure of a display panel according to an embodiment of the present disclosure.

Please refer to FIG. 1, the present disclosure provides a display panel 100 comprising a light-emitting material layer and a first electrode layer 200 disposed on a side of the light-emitting material layer. The light-emitting material layer comprises:

a plurality of first light-emitting devices, wherein a ratio of a first distance between a light-emitting center of each of the first light-emitting devices and the first electrode layer 200 and a wavelength of a light-emitting color of the first light-emitting device is a first ratio; and a plurality of second light-emitting devices, wherein a ratio of a second distance between a light-emitting center of each of the second light-emitting devices and the first electrode layer 200 and a wavelength of a light-emitting color of the second light-emitting device is a second ratio, and the first ratio is not equal to the second ratio.

In the embodiments of the present disclosure, two or more types of light-emitting devices are disposed, a ratio of a distance between light-emitting centers of each type of the light-emitting devices and a first electrode layer and a wavelength of a light-emitting color of the type of the light-emitting devices is different, so that microcavities with different ratios are formed. This can further increase light-emitting efficiency of the light-emitting devices with different colors, improve color saturation of emitted lights, and prolong light-emitting life of the light-emitting devices.

The technical solutions of the present invention will be described below in conjunction with specific embodiments.

Please refer to FIG. 1, the display panel 100 comprises the light-emitting material layer and the first electrode layer 200 disposed on the side of the light-emitting material layer. The light-emitting material layer comprises the first light-emitting devices and the second light-emitting devices. The ratio of the first distance between the light-emitting center of each of the first light-emitting devices and the first electrode layer 200 and the wavelength of the light-emitting color of the first light-emitting device is the first ratio. The ratio of the second distance between the light-emitting center of each of the second light-emitting devices and the first electrode layer 200 and the wavelength of the light-emitting color of the second light-emitting device is the second ratio. The first ratio is not equal to the second ratio. The first light-emitting devices may refer to a plurality of red light-emitting devices 410 and a plurality of green light-emitting devices 420, and the second light-emitting devices may refer to a plurality of blue light-emitting devices 430.

In this embodiment, the display panel 100 further comprises a second electrode layer disposed on another side of the light-emitting material layer and opposite to the first electrode layer 200. Each of the first light-emitting devices, the first electrode layer 200, and the second electrode layer form a first microcavity. Each of the second light-emitting devices, the first electrode layer 200, and the second electrode layer form a second microcavity. In different microcavities, a ratio of a distance between a light-emitting center of a light-emitting device and the first electrode layer 200 and a wavelength of a light-emitting color of the light-emitting device is different. Therefore, the microcavities with different ratios are formed. This can further increase light-emitting efficiency of the light-emitting devices with different colors, improve color saturation of emitted lights, and prolong light-emitting life of the light-emitting devices.

In an embodiment, the first light-emitting devices comprise a plurality of red light-emitting devices 410 and a plurality of green light-emitting devices 420, and the second light-emitting devices comprise a plurality of blue light-emitting devices 430. The wavelength of the light-emitting color of the first light-emitting devices is greater than the wavelength of the light-emitting color of the second light-emitting devices, and the first ratio is less than the second ratio. For wavelengths of different color lights, red light is the longest, green light is the second longest, and blue light is the shortest. Therefore, the red light-emitting devices 410 and the green light-emitting devices 420 correspond to the first light-emitting devices, and the blue light-emitting device 430 correspond to the second light-emitting devices. Reflection distances of the microcavities are matched with the color lights of different wavelengths to divide the microcavities into two types. This can make the color lights of different wavelengths be emitted more efficiently, thereby reaching an optimal value of the light-emitting efficiency of each of the light-emitting devices. The microcavities with different ratios can further increase the light-emitting efficiency of the light-emitting devices with different colors, improve color saturation of emitted lights, and prolong light-emitting life of the light-emitting devices. This not only ensures color gamut coverage of the light-emitting material layer of the display panel 100, but also effectively reduces power consumption of the display panel 100.

Figure 2:
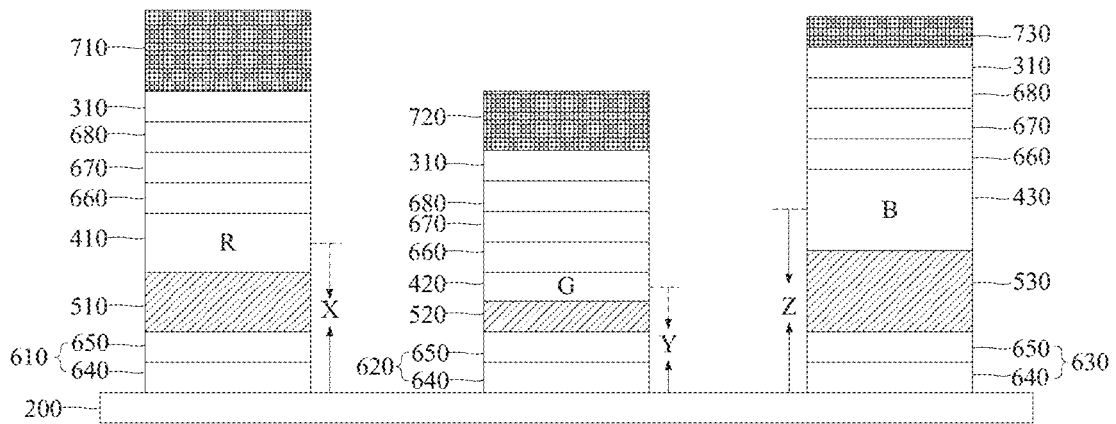
FIG. 2 is a partial structural schematic diagram of a second structure of a display panel according to an embodiment of the present disclosure.
Figure 3:
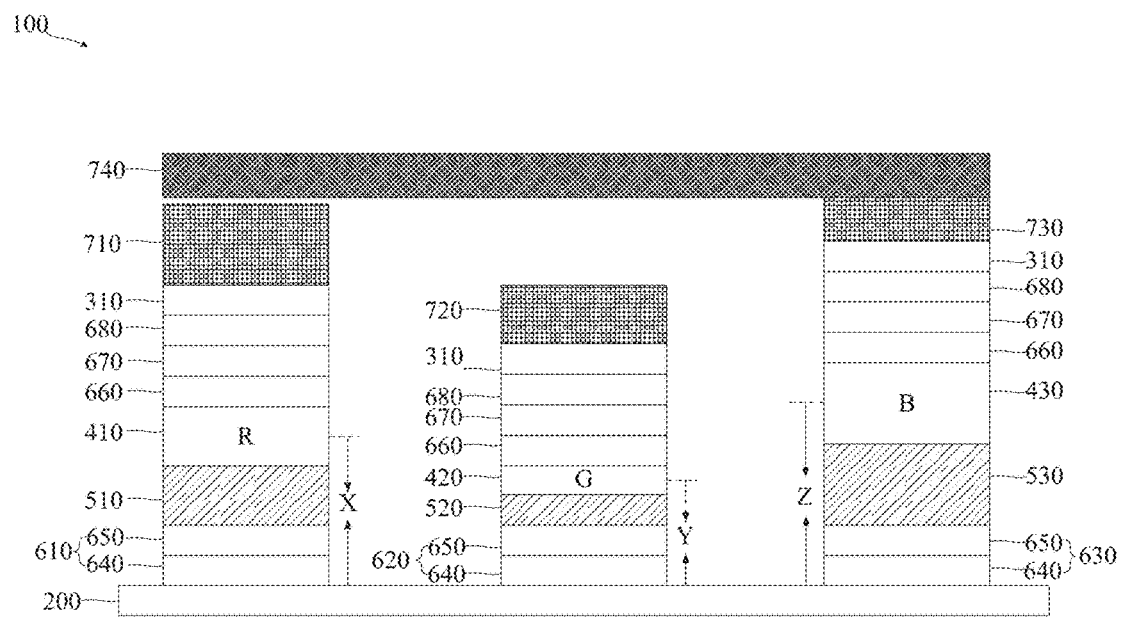
FIG. 3 is a partial structural schematic diagram of a third structure of a display panel according to an embodiment of the present disclosure.

In this embodiment, for ease of viewing, in FIG. 1 to FIG. 4, R also represents the red light-emitting devices 410, G also represents the green light-emitting devices 420, and B also represents the blue light-emitting devices 430. X represents a distance between a light-emitting center of each of the red light-emitting devices 410 and the first electrode layer 200. Y represents a distance between a light-emitting center of each of the green light-emitting devices 420 and the first electrode layer 200. Z represents a distance between a light-emitting center of each of the blue light-emitting devices 430 and the first electrode layer 200. When the first electrode layer 200 of FIG. 1 to FIG. 3 is an anode layer 890 of FIG. 4, it is easy to understand that the anode layer 890 may comprise a plurality of anodes distributed independently.

Figure 5:
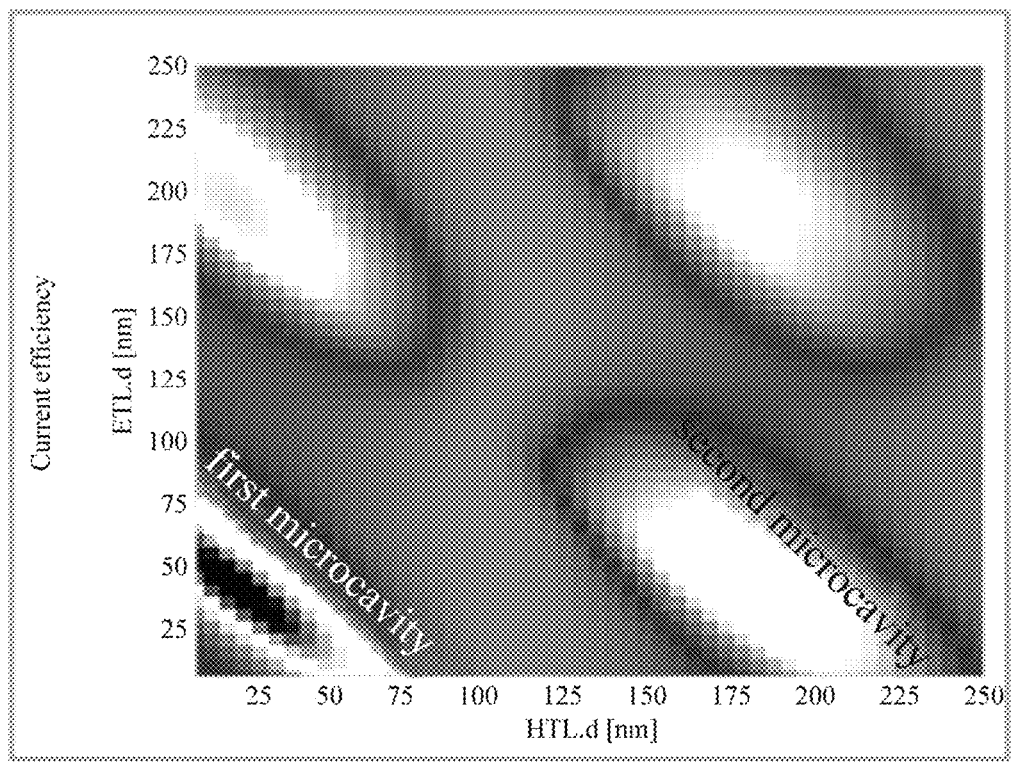
FIG. 5 is a partial schematic diagram of a first effect of a display panel according to an embodiment of the present disclosure.
Figure 6:
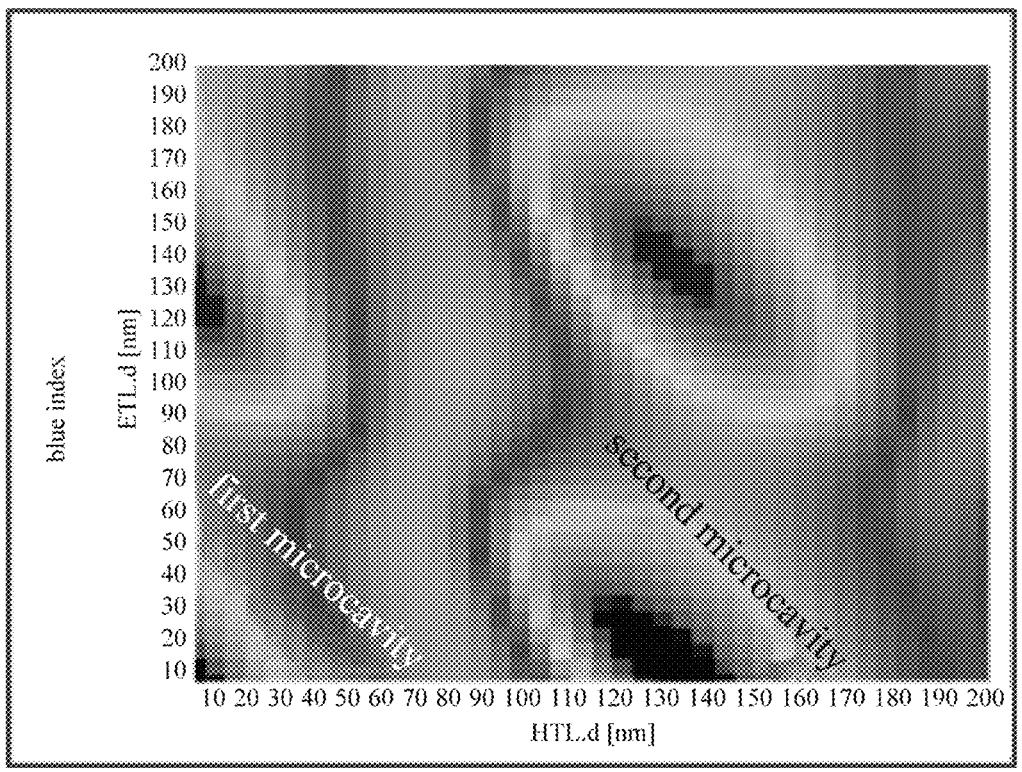
FIG. 6 is a partial schematic diagram of a second effect of a display panel according to an embodiment of the present disclosure.

In this embodiment, the first ratio is 1:4. The second ratio is 1:4/3. That is, the second ratio is 3:4. For example, in FIG. 5 and FIG. 6, the darker the color, the higher the light-emitting efficiency; and the lighter the color, the lower the light-emitting efficiency. In FIG. 5 and FIG. 6, first microcavities refer to microcavities with the first ratio, and second microcavities refer to microcavities with the second ratio. Taking the red light-emitting devices 410 as an example, please refer to FIG. 5, the first microcavity corresponds to one of the red light-emitting devices 410 and has the first ratio of 1:4, and the second microcavity corresponds to another of the red light-emitting devices 410 and has the second ratio of 1:4/3. It can be seen that taking red light as an example, when the ratios are different, the first microcavity with the first ratio of 1:4 has higher light-emitting efficiency than the second microcavity with the second ratio of 1:4/3. Please refer to FIG. 5, the first microcavity corresponds to one of the red light-emitting devices 410 or the green light-emitting devices 420 (that is, the first light-emitting devices) and has the first ratio of 1:4. Please refer to FIG. 6, the second microcavity corresponds to one of the blue light-emitting devices 430 (that is, the second light-emitting devices) and has the second ratio of 1:4/3. It can be seen that when the first light-emitting devices and the second light-emitting devices have corresponding ratios, both have higher light-emitting efficiency. The microcavities with different ratios can further increase the light-emitting efficiency of the light-emitting devices with different colors, improve color saturation of emitted lights, and prolong light-emitting life of the light-emitting devices.

Please refer to FIG. 1. In this embodiment, the display panel 100 further comprises a cavity length adjusting layer disposed between the first electrode layer 200 and the light-emitting material layer. The cavity length adjusting layer comprises a plurality of red adjusting units 510 corresponding to the red light-emitting devices 410, a plurality of blue adjusting units 530 corresponding to the blue light-emitting devices 430, and a plurality of green adjusting units 520 corresponding to the green light-emitting devices 420. A thickness of the blue adjusting units 530 is greater than a thickness of the red adjusting units 510, and the thickness of the red adjusting units 510 is greater than a thickness of the green adjusting units 520. The cavity length adjusting layer adjusts a distance between the first light-emitting devices and the first electrode layer 200, and a distance between the second light-emitting devices and the first electrode layer 200. The cavity length adjusting layer may be a hole transport adjusting layer, which can adjust wavelength reflection distances in the microcavities while adjusting hole transport rates. This saves steps of independently disposing photoresist, simplifies a process, and increases production efficiency.

Please refer to FIG. 2. In this embodiment, a thickness of the second light-emitting devices is greater than a thickness of the first light-emitting devices. A thickness of the blue light-emitting devices 430 is greater than a thickness of the red light-emitting devices 410, and the thickness of the red light-emitting devices 410 is greater than a thickness of the green light-emitting devices 420. Light-emitting efficiency of the blue light-emitting device 430 is not easy to increase. The thickness of the blue light-emitting devices 430 is increased to increase the light-emitting efficiency of the blue light-emitting devices 430 and prolong a service life of the blue light-emitting devices 430. The red light-emitting devices 410 and the green light-emitting devices 420 are disposed in a same manner. This improves the color saturation of the emitted lights, and prolongs the light-emitting life of the light-emitting devices.

Figure 4:
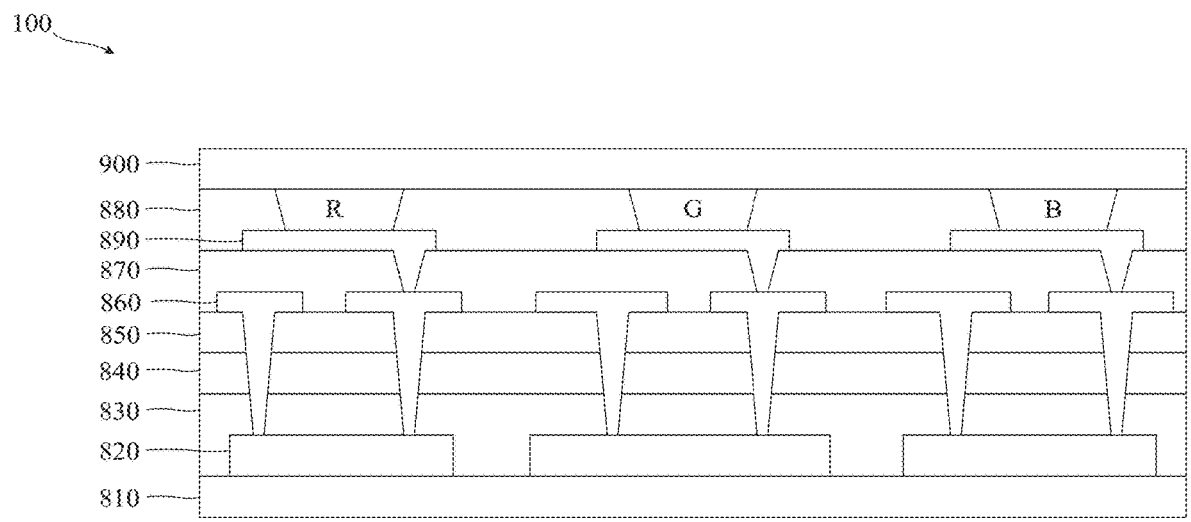
FIG. 4 is a partial structural schematic diagram of a fourth structure of a display panel according to an embodiment of the present disclosure.

Please refer to FIG. 4. In this embodiment, the display panel 100 further comprises the second electrode layer disposed on another side of the light-emitting material layer and opposite to the first electrode layer 200. The first electrode layer 200 is the anode layer 890, and the second electrode layer is a cathode layer 900. The display panel 100 may be top-emitting or bottom-emitting. In this embodiment, the display panel 100 is top-emitting. In this embodiment, the anode layer 890 is made of a totally reflective material, and the cathode layer 900 is made of a transflective material.

Please refer to FIG. 1. In this embodiment, the display panel 100 further comprises a first functional layer and a second functional layer respectively disposed on opposite sides of the first light-emitting devices and the second light-emitting devices. The first functional layer is disposed on the anode layer 890. The first functional layer comprises a plurality of first red functional units 610 corresponding to the red light-emitting devices 410, a plurality of first blue functional units 630 corresponding to the blue light-emitting devices 430, and a plurality of first green functional units 620 corresponding to the green light-emitting devices 420. A thickness of the first blue functional units 630 may be greater than a thickness of the first red functional units 610, and the thickness of the first red functional units 610 may be greater than a thickness of the first green functional units 620 (not shown). The second functional layer comprises a plurality of second red functional units corresponding to the red light-emitting devices 410, a plurality of second blue functional units corresponding to the blue light-emitting devices 430, and a plurality of second green functional units corresponding to the green light-emitting devices 420. The first functional layer further comprises a hole injection layer 640 and a hole transport layer 650. The second functional layer further comprises an electronic functional layer 660, an electron transport layer 670, and an electron injection layer 680. The first red functional units 610, the first green functional units 620, and the first blue functional units 630 may be disposed independently of each other. By adjusting a thickness of each first functional unit, a wavelength reflection distance in a corresponding microcavity is adjusted. This saves the steps of independently disposing photoresist, simplifies the process, and increases the production efficiency. Furthermore, thickening the hole injection layer 640 and the hole transport layer 650 can also increase the light-emitting efficiency of the blue light-emitting devices 430. This improves the color saturation of the emitted lights, and prolongs the light-emitting life of the light-emitting devices.

In this embodiment, the hole transport layer 650 comprises a plurality of red transport units corresponding to the red light-emitting devices 410, a plurality of blue transport units corresponding to the blue light-emitting devices 430, and a plurality of green transport units corresponding to the green light-emitting devices 420. A thickness of the blue transport units is greater than a thickness of the red transport units, and the thickness of the red transport units is greater than a thickness of the green transport units. A material of the hole transport layer 650 is convenient for spacing and shaping, and can effectively raise and support the light-emitting material layer.

Please refer to FIG. 1. In this embodiment, the display panel 100 further comprises a light extracting layer disposed on a side of the cathode layer 900 away from the light-emitting material layer. The light extracting layer comprises a plurality of light extracting units disposed at intervals. The light extracting units may comprise a plurality of red light extracting units 710, a plurality of green light extracting units 720, and a plurality of blue light extracting units 730. The light extracting units can increase light extraction efficiency. The light extracting units are disposed at intervals to better match different types of the microcavities and increase the light extraction efficiency.

Figure 7:
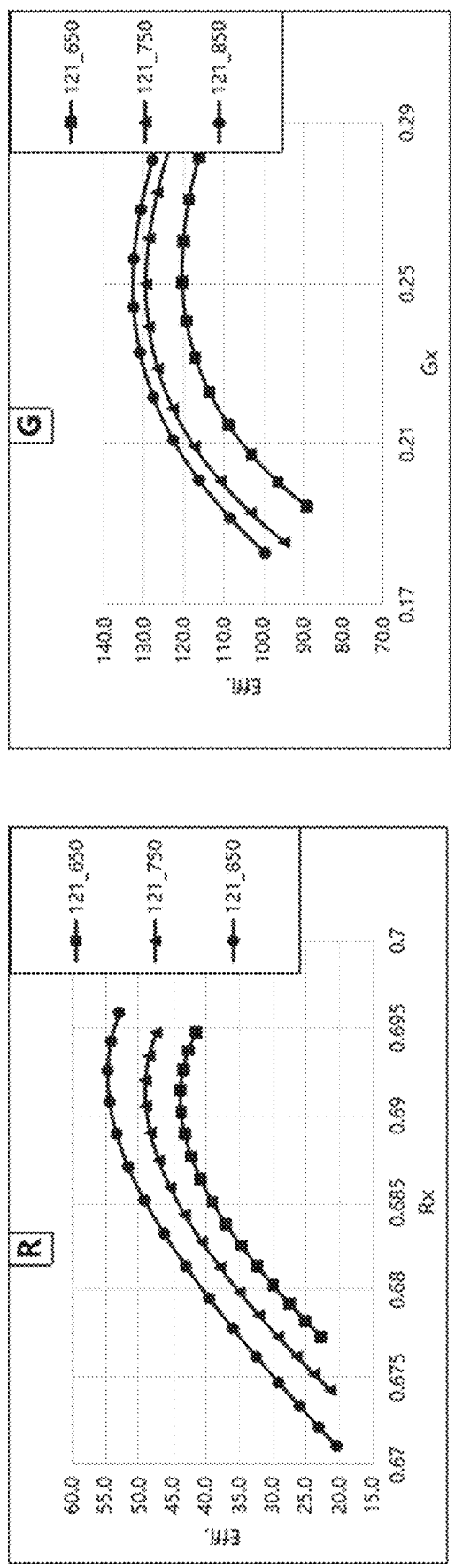
FIG. 7 is a schematic diagram of a second effect of a display panel according to an embodiment of the present disclosure.
Figure 7:
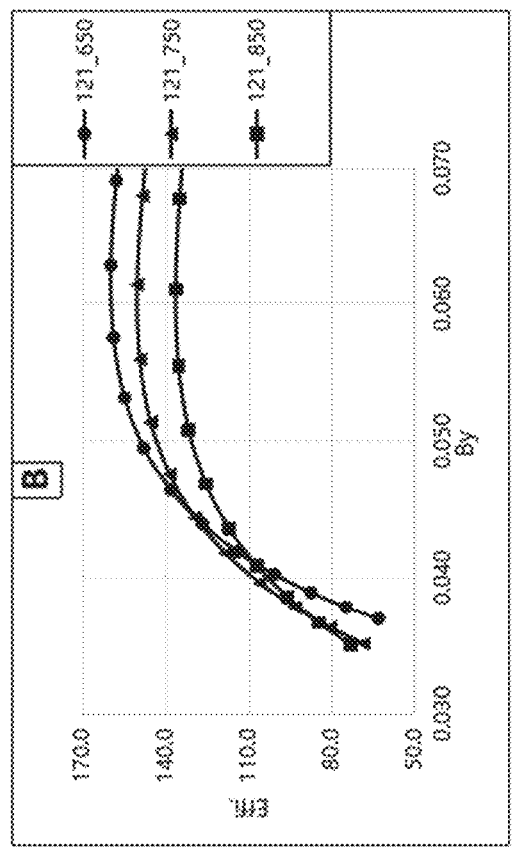

Please refer to FIG. 2. In this embodiment, the light extracting units comprise a plurality of red light extracting units 710 corresponding to the red light-emitting devices 410, a plurality of blue light extracting units 730 corresponding to the blue light-emitting devices 430, and a plurality of green light extracting units 720 corresponding to the green light-emitting devices 420. A thickness of the red light extracting units 710 is greater than a thickness of the green light extracting units 720, and the thickness of the green light extracting units 720 is greater than a thickness of the blue light extracting units 730. Please refer to FIG. 7, the color lights of different wavelengths need to be matched with the light extracting units of different thicknesses. An order of wavelengths from longest to shortest is red, green, and blue, and the light extracting units has different thicknesses as described above to better match the different types of the microcavities, thereby increasing the light extraction efficiency. In any figure of FIG. 7, an abscissa represents a color gamut, and an ordinate represents the light-emitting efficiency. Taking "121_650" in FIG. 7 as an example, it indicates that the anode layer 890 has a thickness of 121 angstroms, and the light extracting unit has a thickness of 650 angstroms. As the light extracting units become thicker, light-emitting efficiency of the red, green, and blue light-emitting devices changes differently. Therefore, different light extracting units are set to have different thicknesses to ensure that the light-emitting efficiency of the red, green, and blue light-emitting devices can achieve the best effect.

Please refer to FIG. 3. In this embodiment, the light extracting layer further comprises a light extracting part 740 formed as an entire layer, and a refractive index of the light extracting part 740 is less than a refractive index of the light extracting units. When a flat layer is required, the entire layer of the light extracting part 740 may be disposed for flattening. Furthermore, disposing the light extracting part 740 and the light extracting units with different refractive indices can better increase the light extraction efficiency.

In this embodiment, the light extracting part 740 may be disposed on a side of the light extracting units away from the first electrode layer 200.

In an embodiment, the light extracting part 740 may be disposed on a side of the light extracting units close to the first electrode layer 200. Planarization is performed first, and then the different light extracting units are respectively disposed. This process is simple and convenient.

In an embodiment, the thickness of the red light extracting units 710, the thickness of the green light extracting units 720, and the thickness of the blue light extracting units 730 are same. A refractive index of the red light extracting units 710 is greater than a refractive index of the green light extracting units 720, and the refractive index of the green light extracting units 720 is greater than a refractive index of the blue light extracting units 730. When the different light extracting units are set to have a same thickness, they need to have different refractive indexes to achieve same or better light extraction efficiency.

Please refer to FIG. 1. In this embodiment, the cathode layer 900 comprises a plurality of cathode unis 310 disposed at intervals. The cathode layer 900 may be continuously disposed, or may be the cathode units 310 disposed at intervals in this embodiment. The cathode units 310 disposed at intervals can better match the different types of the microcavities, thereby increasing the light extraction efficiency and effectively increasing an aperture ratio.

Please refer to FIG. 4. In this embodiment, the display panel 100 further comprises an array substrate disposed on a side of the first electrode layer 200 away from the light-emitting material layer. The array substrate comprises a substrate 810, an active layer 820 disposed on the substrate 810, a first insulating layer 830 disposed on the active layer 820, and a gate layer 840 disposed on the first insulating layer 830, a second insulating layer 850 disposed on the gate layer 840, a source and drain layer 860 on the second insulating layer 850, a third insulating layer 870 disposed on the source and drain layer 860, and a pixel defining layer 880 disposed on the third insulating layer 870. The pixel defining layer 880 is disposed in a same layer as the light-emitting material layer. The pixel defining layer 880 is provided with a plurality of openings. The light-emitting material layer is disposed in the openings. The source and drain layer 860 is electrically connected to the active layer 820 through via holes. The gate layer 840 may have a single-layer gate structure or a double-layer gate structure.

In the embodiments of the present disclosure, two or more types of light-emitting devices are disposed, a ratio of a distance between light-emitting centers of each type of the light-emitting devices and a first electrode layer and a wavelength of a light-emitting color of the type of the light-emitting devices is different, so that microcavities with different ratios are formed. This can further increase light-emitting efficiency of the light-emitting devices with different colors, improve color saturation of emitted lights, and prolong light-emitting life of the light-emitting devices.

The present disclosure further provides a display device comprising any display panel 100 as described above.

In the embodiments of the present disclosure, two or more types of light-emitting devices are disposed, a ratio of a distance between light-emitting centers of each type of the light-emitting devices and a first electrode layer and a wavelength of a light-emitting color of the type of the light-emitting devices is different, so that microcavities with different ratios are formed. This can further increase light-emitting efficiency of the light-emitting devices with different colors, improve color saturation of emitted lights, and prolong light-emitting life of the light-emitting devices.

The technical solutions of the present invention will be described below in conjunction with specific embodiments.

In this embodiment, the display device further comprises an encapsulation layer and a cover layer that are disposed on the display panel 100. The encapsulation layer and the cover layer can effectively protect the display device.

In this embodiment, for a specific structure of the display panel 100, please refer to any of the aforementioned embodiments and the accompanying drawings of the display panel 100, which will not be described herein.

In the embodiments of the present disclosure, two or more types of light-emitting devices are disposed, a ratio of a distance between light-emitting centers of each type of the light-emitting devices and a first electrode layer and a wavelength of a light-emitting color of the type of the light-emitting devices is different, so that microcavities with different ratios are formed. This can further increase light-emitting efficiency of the light-emitting devices with different colors, improve color saturation of emitted lights, and prolong light-emitting life of the light-emitting devices.

The present disclosure provides a display panel and a display device. The display panel comprises a light-emitting material layer and a first electrode layer. The light-emitting material layer comprises a plurality of first light-emitting devices and a plurality of second light-emitting devices. A ratio of a first distance between a light-emitting center of each of the first light-emitting devices and the first electrode layer and a wavelength of a light-emitting color of the first light-emitting device is a first ratio. A ratio of a second distance between a light-emitting center of each of the second light-emitting devices and the first electrode layer and a wavelength of a light-emitting color of the second light-emitting device is a second ratio. The first ratio is not equal to the second ratio. In the embodiments of the present disclosure, two or more types of light-emitting devices are disposed, a ratio of a distance between light-emitting centers of each type of the light-emitting devices and a first electrode layer and a wavelength of a light-emitting color of the type of the light-emitting devices is different, so that microcavities with different ratios are formed. This can further increase light-emitting efficiency of the light-emitting devices with different colors, improve color saturation of emitted lights, and prolong light-emitting life of the light-emitting devices.

It should be understood that those skilled in the art may make equivalent replacements or changes based on the technical solutions and inventive concepts of the present application, and all such changes or replacements shall fall within the scope of the claims of the present application.

What is claimed is:

1. A display panel, comprising a light-emitting material layer and a first electrode layer disposed on a side of the light-emitting material layer, wherein the light-emitting material layer comprises:

a plurality of first light-emitting devices, wherein a ratio of a first distance between a light-emitting center of each of the first light-emitting devices and the first electrode layer and a wavelength of a light-emitting color of the first light-emitting device is a first ratio; and a plurality of second light-emitting devices, wherein a ratio of a second distance between a light-emitting center of each of the second light-emitting devices and the first electrode layer and a wavelength of a light-emitting color of the second light-emitting device is a second ratio, and the first ratio is not equal to the second ratio;

wherein the display panel further comprises a second electrode layer disposed on another side of the light-emitting material layer and opposite to the first electrode layer, the first electrode layer is an anode layer, and the second electrode layer is a cathode layer;

wherein a light extracting layer is disposed on a side of the cathode layer away from the light-emitting material layer, and the light extracting layer comprises a plurality of light extracting units disposed at intervals;

wherein the light extracting layer further comprises a light extracting part formed as an entire layer on the light extracting units, the light extracting part covers the light extracting units, and a refractive index of the light extracting part is less than a refractive index of the light extracting units;

wherein the first light-emitting devices comprise a plurality of red light-emitting devices and a plurality of green light-emitting devices, the second light-emitting devices comprise a plurality of blue light-emitting devices, the wavelength of the light-emitting color of the first light-emitting devices is greater than the wavelength of the light-emitting color of the second light-emitting devices, and the first ratio is less than the second ratio; and wherein the light extracting units comprise a plurality of red light extracting units corresponding to the red light-emitting devices, a plurality of blue light extracting units corresponding to the blue light-emitting devices, and a plurality of green light extracting units corresponding to the green light-emitting devices, a thickness of the red light extracting units is greater than a thickness of the green light extracting units, and the thickness of the green light extracting units is greater than a thickness of the blue light extracting units.

2. The display panel according to claim 1, wherein the first ratio is 1:4, and the second ratio is 1:4/3.

3. The display panel according to claim 1, further comprising a cavity length adjusting layer disposed between the first electrode layer and the light-emitting material layer, wherein the cavity length adjusting layer comprises a plurality of red adjusting units corresponding to the red light-emitting devices, a plurality of blue adjusting units corresponding to the blue light-emitting devices, and a plurality of green adjusting units corresponding to the green light-emitting devices, a thickness of the blue adjusting units is greater than a thickness of the red adjusting units, and the thickness of the red adjusting units is greater than a thickness of the green adjusting units.

4. The display panel according to claim 1, wherein a thickness of the blue light-emitting devices is greater than a thickness of the red light-emitting devices, and the thickness of the red light-emitting devices is greater than a thickness of the green light-emitting devices.

5. The display panel according to claim 1, further comprising a first functional layer and a second functional layer respectively disposed on opposite sides of the first light-emitting devices and the second light-emitting devices, wherein the first functional layer is disposed on the anode layer, the first functional layer comprises a plurality of first red functional units corresponding to the red light-emitting devices, a plurality of first blue functional units corresponding to the blue light-emitting devices, and a plurality of first green functional units corresponding to the green light-emitting devices, a thickness of the first blue functional units is greater than a thickness of the first red functional units, and the thickness of the first red functional units is greater than a thickness of the first green functional units.

6. A display device, comprising a display panel, wherein the display panel comprises a light-emitting material layer and a first electrode layer disposed on a side of the light-emitting material layer, and the light-emitting material layer comprises:

a plurality of first light-emitting devices, wherein a ratio of a first distance between a light-emitting center of each of the first light-emitting devices and the first electrode layer and a wavelength of a light-emitting color of the first light-emitting device is a first ratio; and a plurality of second light-emitting devices, wherein a ratio of a second distance between a light-emitting center of each of the second light-emitting devices and the first electrode layer and a wavelength of a light-emitting color of the second light-emitting device is a second ratio, and the first ratio is not equal to the second ratio;

wherein the display panel further comprises a second electrode layer disposed on another side of the light-emitting material layer and opposite to the first electrode layer, the first electrode layer is an anode layer, and the second electrode layer is a cathode layer;

wherein a light extracting layer is disposed on a side of the cathode layer away from the light-emitting material layer, and the light extracting layer comprises a plurality of light extracting units disposed at intervals;

wherein the light extracting layer further comprises a light extracting part formed as an entire layer on the light extracting units, the light extracting part covers the light extracting units, and a refractive index of the light extracting part is less than a refractive index of the light extracting units;

wherein the first light-emitting devices comprise a plurality of red light-emitting devices and a plurality of green light-emitting devices, the second light-emitting devices comprise a plurality of blue light-emitting devices, the wavelength of the light-emitting color of the first light-emitting devices is greater than the wavelength of the light-emitting color of the second light-emitting devices, and the first ratio is less than the second ratio; and wherein the light extracting units comprise a plurality of red light extracting units corresponding to the red light-emitting devices, a plurality of blue light extracting units corresponding to the blue light-emitting devices, and a plurality of green light extracting units corresponding to the green light-emitting devices, a thickness of the red light extracting units is greater than a thickness of the green light extracting units, and the thickness of the green light extracting units is greater than a thickness of the blue light extracting units.

7. The display device according to claim 6, wherein the first ratio is 1:4, and the second ratio is 1:4/3.

8. The display device according to claim 6, further comprising a cavity length adjusting layer disposed between the first electrode layer and the light-emitting material layer, wherein the cavity length adjusting layer comprises a plurality of red adjusting units corresponding to the red light-emitting devices, a plurality of blue adjusting units corresponding to the blue light-emitting devices, and a plurality of green adjusting units corresponding to the green light-emitting devices, a thickness of the blue adjusting units is greater than a thickness of the red adjusting units, and the thickness of the red adjusting units is greater than a thickness of the green adjusting units.

9. The display device according to claim 6, wherein a thickness of the blue light-emitting devices is greater than a thickness of the red light-emitting devices, and the thickness of the red light-emitting devices is greater than a thickness of the green light-emitting devices.

10. The display device according to claim 6, further comprising a first functional layer and a second functional layer respectively disposed on opposite sides of the first light-emitting devices and the second light-emitting devices, wherein the first functional layer is disposed on the anode layer, the first functional layer comprises a plurality of first red functional units corresponding to the red light-emitting devices, a plurality of first blue functional units corresponding to the blue light-emitting devices, and a plurality of first green functional units corresponding to the green light-emitting devices, a thickness of the first blue functional units is greater than a thickness of the first red functional units, and the thickness of the first red functional units is greater than a thickness of the first green functional units.

\* \* \* \* \*